United States Patent
Klein et al.

(10) Patent No.: US 8,214,180 B2
(45) Date of Patent: Jul. 3, 2012

(54) METHOD FOR THE COMPUTER-AIDED SIMULATION OF TECHNICAL PROCESSES

(75) Inventors: Peter Klein, Wernersberg (DE); Dirk Merten, Kaiserslautern (DE)

(73) Assignee: Fraunhofer-Gesellschaft . . . e.V., München (DE)

( * ) Notice: Subject to any disclaimer, the term of this patent is extended or adjusted under 35 U.S.C. 154(b) by 347 days.

(21) Appl. No.: 12/085,926

(22) PCT Filed: Nov. 22, 2006

(86) PCT No.: PCT/EP2006/011197
§ 371 (c)(1), (2), (4) Date: Apr. 17, 2009

(87) PCT Pub. No.: WO2007/062769
PCT Pub. Date: Jun. 7, 2007

(65) Prior Publication Data
US 2009/0228248 A1    Sep. 10, 2009

(30) Foreign Application Priority Data

Dec. 2, 2005   (DE) .......................... 10 2005 057 697

(51) Int. Cl.
G06F 7/60 (2006.01)
G06F 17/10 (2006.01)
G06G 7/48 (2006.01)

(52) U.S. Cl. ................................ 703/2; 703/6
(58) Field of Classification Search .................. 703/2, 6
See application file for complete search history.

(56) References Cited

U.S. PATENT DOCUMENTS 6,353,768 B1 * 3/2002 Karafillis et al. ............... 700/97
(Continued)

FOREIGN PATENT DOCUMENTS
WO    2006044258    4/2006

OTHER PUBLICATIONS

Owen, D. R. J.; Feng, Y. T.: "Parallelised finite/discrete element simulation of multi-fracturing solids and discrete systems".
(Continued)

*Primary Examiner* — Dwin M Craig
*Assistant Examiner* — Aniss Chad
(74) *Attorney, Agent, or Firm* — Jacobson Holman PLLC (57) ABSTRACT

The invention relates to a method for computer-aided simulation of technical processes. Methods of this type are required in particular in evolution simulation models of technical, in particular physical and/or chemical processes, which are intended to be propagated in time (evolution). The method according to the invention for computer-aided simulation of the temporal propagation of technical processes as evolution problem, which is described by at least two different mathematical models as sub-evolution problems which use discretization entities which are different from each other and are propagated in time by means of model-specific algorithms, the simulation being implemented by means of a large number of calculation units, is characterized in that the mathematical models are reproduced on a single coherent graph structure (1) with the discretization entities as nodes (2) and the neighborhood relations thereof as edges (3), edges (3a, 3b) being produced between discretization entities belonging to the same model and also edges (3c) between discretization entities belonging to different models, respectively for the nodes assigned respectively to one mathematical model, for the edges (3a, 3b) between nodes belonging to the same model and also for nodes belonging to different models, respectively specific evolution operators being indicated, and the graph being propagated in time using these evolution operators.

14 Claims, 11 Drawing Sheets

U.S. PATENT DOCUMENTS

2002/0188373 A1 12/2002 Goddard et al. ............. 700/200
2003/0135621 A1* 7/2003 Romagnoli ................... 709/226
2004/0194048 A1 9/2004 Arnold ........................... 716/17

OTHER PUBLICATIONS

Afeyan Bedros et al.; "Modeling and Design of Optical Semi-conductor Devices Using FEMLAB, Wavelets and Adaptivity".

Hendrickson B et al.: "Graph partitioning models for parallel computing".

Karypis G et al.: Multilevel Algorithms for Multi-Constraint graph partitioning.

Schloegel K et al.: "Graph Partitioning for Dynamic, Adaptive and Multi-phase Scientific Simulations".

L. Oliker, et al.; Scientific Computations on Modern Parallel Vector Systems, Proceedings of the SC2004 conference, Pittsburgh, PA.

\* cited by examiner

Pseudo GraPA user code for molecular dynamics (MD) calculations:

```
int main( int argc, char** argv)

Registry R;  /* a GraPA object which creates the BDE containers during the
                    construction of the GraPA_Framework */
    R.register_BDE< MD_Particle >();   /* initializes the factories of MD_Particle containers*/
    R.register_Link < MD_Particle_Link > ();  /* initializes factories of link containers */

InteractionForce Force;  /* function object, calculate forces using link information */
    Liouville_V UV;          /* function object, updates the velocity of MD_Particle using forces */
    Liouville_Q UQ;          /* function object, updates coordinates using the velocity */

Graph G;  /* connection to geometrical aspects of a specific problem.
                 Nodes are particles, links denote interaction lines between particles,
                 all nodes and links have the same colour, say red. */

GraPA_Framework  Framework( R, G ) /*initializes the GraPA framework with
                                         concrete, simulation specific geometric
                                         information (G) and modelling data types (R)
                                         uses the factories in order to allocate
                                         the object containers*/

/* time loop: Leap frog MD algorithm */
    for (int i = 0; i < max_timestep; i++)
    {
        Framework.node_loop( UQ );  /* apply UQ to all MD_Particle BDE's */
        Framework.link_loop( Force );  /* calculate all forces using along links */
        Framework.node_loop( UV );  /* apply UV to all MD_Particle BDE's */
    }
return 0;
```

Figure 6

Pseudo GraPA user code for finite elements (FE) calculations:

Time-explicit diagram, Crank-Nicolson with lumped mass approximation of the FE integrals. Vertex-based implementation of the wave equation, demonstrates the use of the pipeline.

```
int main( int argc, char** argv)
{
    Registry R;  /* a GraPA object which creates the BDE containers during the
            Construction of the GraPA_Framework */
    R.register_BDE< FE_Vertex>();  /* initializes the factories of vertex containers*/
    R.register_Link < FE_Link > ();  /* initializes factories of links between verticees */

CorrectTimeLevel  CTL;  /* used for "advection" of u_(n+1), u_n, u_(n-1) */
    CrancNickolsonTime CNT; /* used for time like derivative of Crank-Nicolson */
    CrancNicolsonSpace CNS; /* used for lumped mass Laplacian */

Graph G; /* connection to geometrical aspects of a specific problem.
            Nodes are vertices of finite elements,
            links are set if two verticees belong to the
            same edge of a finite element,
            all nodes and links have the same colour, say blue */
    GraPA_Framework  Framework( R, G ) /*initializes the GraPA framework with
                                concrete, simulation specific geometric
                                information (G) and
                                modelling data types (R),
                                uses the factories in order to allocate
                                the object containers*/
    /* time loop: Cranc-Nocolson with lumped mass Laplacian */
    for (int i = 0; i < max_timestep; i++)
        {
            Framework.pipeline( CNT, CNS ) ; /* pipelined update:
                                time derivatives in node op, CNT
                                lumped mass Laplacian CNS as link op.
                                This is bitwise equivalent to but faster than:
                                Framework.node_loop( CNT ) ;
                                Framework.link_loop( CNS ); */
            Framework.node_loop( CTL);  /* prepare next time step */
        }
    return 0;
```

Fig. 7

Pseudo GraPA user code for coupled MD-FE calculations:

Demonstration of mixed use of "pipeline" with "node_loop" and "link_loop".

```
int main( int argc, char** argv)
{
    Registry R;  /* a GraPA object which creates the BDE containers during the
                    Construction of the GraPA_Framework */

/* The FE part as in fig. 7 */
        /* register FE data types */
    R.register_BDE< FE_Vertex>();
    R.register_Link < FE_Link > ();
        /* FE operators */
    CorrectTimeLevel CTL;
    CrancNickolsonTime CNT;
    CrancNicolsonSpace CNS;

/* The MD part as in fig. 6 */
        /* register MD data types */
    R.register_BDE< MD_Particle >();
    R.register_Link < MD_Particle_Link > ();
        /* MD operators */
    InteractionForce Force;
    Liouville_V UV;
    Liouville_Q UQ;

/* Coupling operators for MD<->FE
   operating on links between their corresponding BDE's */
    CalcDisplacementMD Coupling_MD_FE;
    CalcForceFE        Coupling_FE_MD;

Graph G = Graph_MD + Graph_FE + InterGraphLinks;
        /* connection to geometrical aspects of a specific problem.
            Graph_MD (red) and Graph_FE(blue) as above, additionally
            Define links between MD particles and FE vertices
            in InterGraphLinks.*/
```

Fig. 8a

```
GraPA_Framework  Framework( R, G ) /*initializes the GraPA framework with
                                      concrete, simulation specific geometric
                                      information (G) and modelling data types (R),
                                      uses the factories in order to allocate
                                      the object containers*/
   /* time loop:*/
   for (int i = 0; i < max_timestep; i++)
      {
         /* MD update */
         Framework.node_loop( UQ ) ;
         Framework.link_loop( Force );
         Framework.node_loop( UV );

/*coupling FE-MD */
         Framework.link_loop (Coupling_MD_FE);
         Framework.link_loop (Coupling_FE_MD);

/* FE update */
         Framework.pipeline( CNT, CNS ) ;
         Framework.node_loop( CTL);   /* prepare next time step */
      }
   return 0;
}
```

Fig. 8b

METHOD FOR THE COMPUTER-AIDED SIMULATION OF TECHNICAL PROCESSES

This is a national stage of PCT/EP06/011197 filed Nov. 22, 2006 and published in German.

The present invention relates to a method for computer-aided simulation of technical processes. Methods of this type are required in particular in evolution simulation models of technical, in particular physical and/or chemical processes, which are intended to be propagated in time (evolution).

Simulations of technical processes generally start from the fact that mathematical models are produced with which the technological process is represented in an approximated manner. For example conventional or partial differential equations or differential equation systems serve as mathematical models. These use so-called basic discretisation entities (BDE) which make the solution of these equations accessible for calculation with the help of a computer. This is effected in that the BDEs are reproduced on discrete data structures and are propagated in time with the help of mathematical algorithms or operators. The propagation can thereby also include random elements.

The additional abstraction plane of the method according to the invention permits a generic optimisation of the propagation of evolution problems on the most varied of hardware architectures, the optimisation remaining hidden behind a general interface which does not depend upon the special evolution problems and not upon hardware architectures. In contrast thereto, such optimisations in the state of the art are restricted to monolithic approaches for special evolution problems and special hardware architectures so that these approaches are always accessible only to experts for special hardware architectures. This type of optimisation is therefore available generically neither to new evolution problems nor to new hardware architectures. Usually, this complex optimisation strategy is also not economically sensible since a considerable complexity in maintenance and transfer operations of the implemented evolution problems would inherently be involved in this approach. The present invention abstracts the required expert knowledge for hardware-specific optimisation and hence ensures the transferability with high performance of the most varied of evolution problems which were implemented according to the method according to the invention. This new optimisation is also available generically to non-experts for special hardware architectures and represents a significant economic advantage.

The state of the art in the field of this disclosure is presented in a comprehensive manner in the general article by L. Oliker, et al., Scientific Computations on Modern Parallel Vectorsystems, Proceedings of the SC2004 conference, Pittsburgh, Pa. It should be confirmed in general that simulation of evolution problems, implemented according to the state of the art on distributed and networked calculation units, have a performance of approx. 5-10% of the theoretically possible peak performance.

Further evolution problems which were implemented according to the state of the art at the Fraunhofer ITWM, are compiled in the ParPac simulation packet for solving the so-called lattice-Boltzmann equation (activity report Institute for Techno- and Economic Mathematics 1999, pages 24-28, obtainable at the press office of the Institute for Techno- and Economic Mathematics, Gottlieb-Daimler-Straße, 76857 Kaiserslautern. This publication is also contained in its entirety in the disclosure of the present application). ParPac was parallelised for networked and distributed calculation units according to the state of the art and, on current hardware architectures, in correspondence with the state of the art, provides approx 7% of the theoretical peak performance.

It emerged here that, by using the present invention in this concrete application, a performance improvement by the factor 4 is achieved on current hardware architectures. The economical advantage purely from the performance increase can even be qualified here: for ParPac simulations according to the state of the art, with the same response time, a parallel computer system which is greater by the factor 4 than with additional use of the present invention is required, which leads with thousands of networked processors to significantly higher purchasing and operating costs.

These frameworks according to the above-described state of the art can very specifically take into account varying hardware specifics for a specific mathematical model. A generic optimisation and possibly parallelisation of the propagation in time, which is therefore not dependent upon the chosen BDE and the chosen mathematical model, is not achieved in these frameworks.

With these approaches, also by using merely one sort of BDEs, the integrated coupling of different applications, as is required for instance in multiphysics simulations, is precluded from the beginning.

With the software library MPCCI, in fact the possibility exists of coupling different finite element-based applications with each other but no coupling exists to other mathematical methods which are based for example on particles or wavelets. Also an integrated hardware-approximating optimisation of the individual finite element-solvers is lacking in this program packet.

The program packet FEMLAB goes a step further here in that a series of coupling algorithms is made available, however again also merely for finite element-based methods. However, the individual methods must necessarily be based on the finite element method.

Since however not all technologically important problems, for instance in the field of nanotechnology, can be modelled with finite elements, there is a requirement here for new methods.

It is therefore the object of the present invention to make available a method for computer-aided simulation of technological processes, which makes it possible to link different mathematical models based on different discretisation entities with each other and at the same time to produce generically, independently of the chosen mathematical model, a hardware-specific optimisation of the computing process.

This object is achieved by the method according to claim 1. Advantageous developments of the method according to the invention, in particular also the generic parallelisation of evolution problems on networked calculation units, are indicated in the respective dependent claims.

According to the invention, at least two different mathematical models, which are based on different discretisation entities, are combined to form a common evolution problem in that an additional abstraction plane, which is of higher order than the mathematical models, is introduced. This abstraction plane comprises a graph on which the mathematical models are reproduced as general evolution problems. The discretisation entities, such as for example finite elements, wavelets or particles and the like, and also the neighbourhood relations, are represented as nodes and edges (links) of the graph. They are therefore the basic elements of the geometry of the evolution problem. The evolution algorithms which describe the temporal propagation of the discretisation entities and also the neighbourhood relations thereof, i.e. the nodes and the edges, are reduced to generic operators. These evolution operators are made available respectively generically and uniformly for the nodes which are uniform with respect to the assigned discretisation entity. Generic evolution operators are also made available for the edges of the graph, i.e. for the edges which connect between nodes of the same discretisation entity, respectively uniform operators are made available, which are then likewise applied to all nodes of this type. Also for the edges which connect different discretisation entities and hence are assigned to different mathematical models, respectively generic evolution operators are made available, with which these edges can be propagated in time uniformly.

Although the method according to the invention introduces the entire graph as an additional abstraction plane and the parallelisation and optimisation is implemented by generic operators, the simulation is significantly accelerated or the required computing power is reduced contrary to expectation.

Whilst efforts are made in the state of the art to use the available computing power optimally by means of problem-specific algorithms, the present invention follows the opposite route and generalises the problem. Nevertheless, power increases by the factor 4 are observed in first concrete applications.

Advantageously, a criterion is assigned to each of the nodes and the edges, said criterion characterising the associated discretisation entity or the type of nodes connected by the edges. For example a colour can be chosen as characteristic. If the entire evolution problem comprises two mathematical models, for example a model based on finite elements and a model based on particles, then all the nodes which represent finite elements obtain one colour, for example blue, whilst all the nodes, on which particles were reproduced, obtain for example the colour red. The edges between two nodes, on which particles were reproduced, are then likewise red, the colour of the edges which connect nodes on which the finite elements were reproduced are then blue, whilst the colour of those edges which connect a node on which a finite element was reproduced and a node on which a particle was reproduced are characterised as two-coloured blue-red. This means that precisely one discretisation entity is associated with each characteristic, the number of characteristics and hence the number of sub-evolution problems (mathematical models) being able to be of any arbitrary size. Each edge of the graph therefore carries automatically the two colours of the nodes which are connected by the edge. Hence then also a basic difference is produced between intra-edges (intra-links) within one sub-evolution problem (single-coloured) and inter-edges (inter-links) between two different sub-evolution problems (two-coloured).

It is thereby essential that the two different mathematical problems can describe not only the technical process in different spatial or temporal regions but that the models can exist adjacently also in the same spatial and temporal region of a technical process. This means that the technical process is then described by both mathematical models for the same spatial and/or temporal region.

The graph thereby need not remain static since nodes can change the colour, for example if one particle from the region described by a molecular dynamic module moves in a region which is described by finite elements. In this case, the nodes and/or edges then also change the colour. It is also possible to produce or to destroy nodes and/or edges dynamically.

The hardware-specific reduction and parallelisation of the graph can now be prepared for the graph itself without knowledge of the technical processes and mathematical models implemented in the graph. The present invention hence makes it possible to optimise the simulation methods on hardware architectures and, at the same time, enables the transferability to fundamentally different architectures. The graph thereby serves as abstract interface.

The present invention hence makes it possible to reduce and to partition the graph generically into individual problems and consequently to parallelise it without knowing the concrete technical process. This additional abstraction plane of the graph hence makes possible a generic and automatic parallelisation, for example taking into account the hardware specifics. The simulation can be described completely as a method consequently starting from the graph, and the user need merely establish the respective graph structure as a function of the technical process to be simulated by him. As a result, the concrete reduction of the problem and partitioning or parallelisation is decoupled from the concrete problem and the mathematical models used for the simulation and description thereof.

Also a plurality of planes of a reduction is possible as problem reduction, so that, apart from the problem-specific granularity, in addition hardware characteristics which can be regarded as static are taken into account. This makes it possible to adapt the partitioning to the size and depth of the memory hierarchy, the use and distribution of shared memory systems or the network connection and topology which are used, as a result of which a hardware-specific optimisation is achieved. If the entire graph changes dynamically, also the static aspects of the problem reduction can be adapted dynamically to the new graph as long as a performance improvement of the simulation method is produced therefrom. Concrete implementations of this optimisation are however hardware architecture-dependent.

Furthermore, different generic abstract access mechanisms to nodes and/or edges of the graph can be provided and general communication patterns implemented. The abstraction of the graph also enables here again an architecture-specific optimisation in that the internal course of these mechanisms is coordinated to the hardware. Thus for example with each temporal step of the calculation of the evolution problem, the memory accesses can be reduced by maximised vector lengths or cache reuse. Also the parallel communication patterns can be optimised by a chromatically ordered communication graph (communication pattern) which can be used here according to the invention. A chromatically ordered communication graph of this type is described in "Peter Klein, Activity Report of the Institute for Techno- and Economic Mathematics 1999, pages 28, 29, obtainable at the press office of the Fraunhofer ITWN, Gottlieb Daimler Straβe 76857 Kaiserslautern". This publication is contained in its entirety in the disclosure of the present application.

The present invention allows the user to define and use any typical data structures and also evolution operators. Implementation of the parallelisation remains hidden to the user behind the general interface, the graph, which implements the method for propagation of the graph as a function of hardware and generically, i.e. independently of the concrete data structure and the concrete evolution operators. The present invention is therefore not restricted to individual methods and problems but can be used in general in simulation and evolution models. It has particular advantages in the field of multiphysics simulation models in which mathematical models which are different in regions and/or timewise are used with different discretisation entities.

The present invention therefore achieves a generic optimisation on all hardware planes adapted to architecture-specific characteristics.

Thus for example with cache-based machines, small memory regions but ones which are referred to again and again can be maximised with respect to their cache reuse, whilst, with computers with vector architecture, an optimum, i.e. greatest possible vector length, should be chosen in order to achieve a high data throughput.

Particularly advantageously, the use of memory hierarchies can be optimised when using a computer with an n-fold associative L2-cache memory, in that the graph is reduced into individual sub-graphs and the individual sub-graphs in the main memory are stored respectively approximately or precisely in the size of one of the n memory regions (L2 blocks). Subsequently all the node operators and link operators (propagations of the nodes and edges) which access the same memory region are implemented directly in succession in blocks as far as possible. Firstly all the node operators and then all the link operators which access the same memory region are therefore configured, whereupon a transfer is made to the node operators and link operators which access the next memory region. In this way, it is possible to use the cache memory optimally. In the state of the art, it has been normal to date to implement all the node operators first and only then all the link operators. In contrast, the logic pipelining according to the invention leads to a significantly improved performance with a hardware specification which remains the same.

This method, described here for an L2-cache memory, can be applied correspondingly also to other memory hierarchies (cache hierarchies). In the case of a plurality of cache memory planes (k is a natural number), the subdivision into sub-graphs can therefore be undertaken such that each sub-graph is stored in the main memory respectively in a memory region, the size of which corresponds to the size of a memory block of one of the k cache memories. If the cache hierarchy therefore has k memory planes, then the $m^{th}$ memory plane can be chosen for example for optimisation. If this is achieved by an n-fold associative memory with n memory blocks, each memory block having a size of x kbyte, then the graph is subdivided into sub-graphs such that each sub-graph in the main memory occupies a memory region of x kbyte. However, it already suffices also to store each sub-graph in the main memory in a memory region with roughly or approximately but not exactly x kbyte in order to achieve a performance improvement. In the case of more than two cache hierarchy planes (k>2), the method according to the invention can be optimised by selecting the suitable $m^{th}$ memory plane.

With the method according to the invention, in particular using the above-described chromatically ordered communication pattern, a conflict-free task processing of different processors which operate in parallel can also be achieved. Dead-locks and congestion can consequently be avoided. In addition, the possibility of using communication threads transparently ensures asynchronicity between calculation on an SMP node and communication between these SMP nodes and hence optimum usage of hardware parallelism. Further advantageous implementation strategies are indicated in the subsequent table.

| Architecture | Hardware characteristics | Requirement for implementation | Policy according to the invention |
| --- | --- | --- | --- |
| Vector machines | Vector pipelines | Optimum vector lengths | Allocator policy for links and nodes |
| | | Maintain data locality in the case of dynamic graphs | Restore node and link data |
| Mulitcore architectures | One code and data main memory <-> many core processor memories | Optimum memory block sizes | Data memory and code memory must be adapted to each other. |
| | | Reuse | Application-dependent: data reuse -> code pipelining code reuse -> data pipelining |
| e.g. cell | 1 DMAC and 8 vector units | Conflict-free loading of data and/or algorithms | Queuing |

The method according to the invention is described subsequently with reference to Figures.

There are shown

Figure 1:
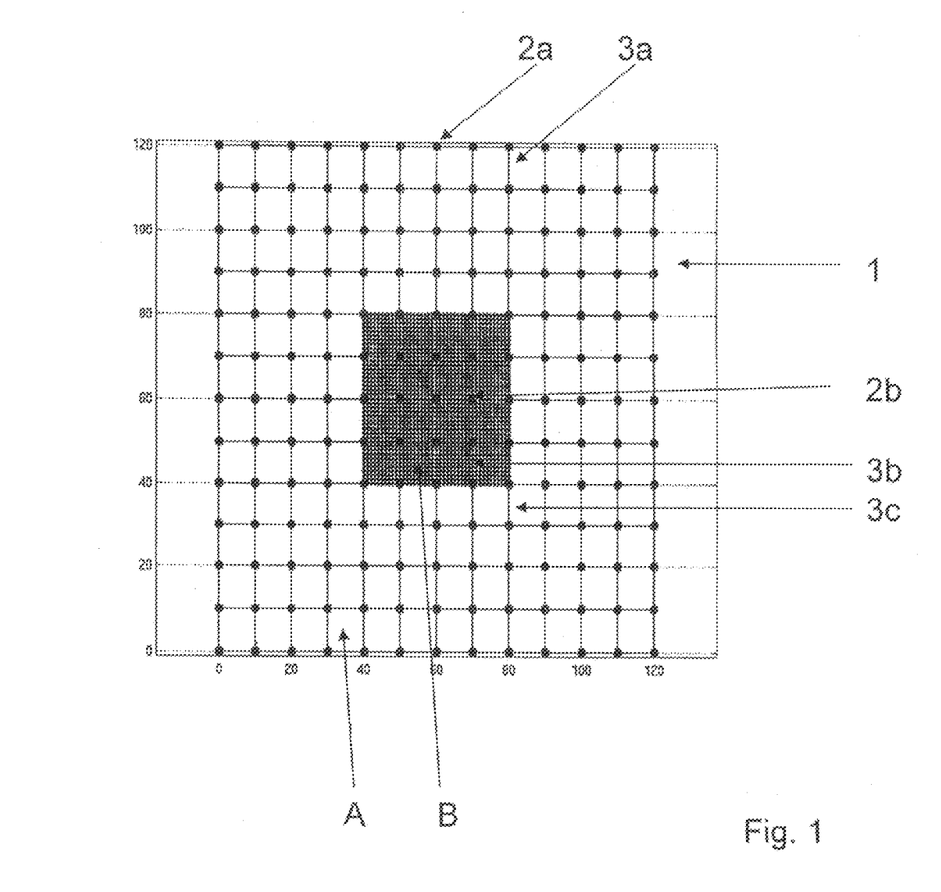
FIG. 1 a graph according to the invention.

FIG. 1 shows a graph according to the invention of a multiphysics application according to the present invention.

In a first physical computing area A (represented in a light colour), the finite element method is used for simulation of the physical problem in order to implement a continuum-mechanical description of the behaviour of a material. In a second computing area B (grey background), the so-called molecular dynamics is used in order to propagate atoms in time. In region A, finite elements are therefore used as discretisation element, whilst particles are used as discretisation element in region B. The particles have their coordinates, speeds and also particle identification as data. The coordinates are propagated in time with the help of the speed. For this purpose, a node operator is implemented as evolution operator. The speeds are propagated with forces, the forces depending upon neighbouring atoms. This was implemented as link operator.

In region A of the finite elements, the discretisation entity comprises one finite element, the displacement of the finite element being achieved with the help of standard methods which are implemented as node and edge operators of the finite elements.

For the coupling region which is reproduced by an inter-graph, specific operators are defined which transcribe the behaviour of a finite element into the behaviour of a particle or vice versa.

In FIG. 1, the finite elements 2a are therefore the discretisation entities of region A which are connected to each other via intra-links (intra-nodes) 3a. The particles 2b in region B are connected to each other by intra-nodes 3b. The connection between the particles 2b and the finite elements 2a is effected via inter-links (inter-nodes) 3c.

It should be noted here that the regions A and B need not necessarily be spatially different regions. These can also merely be temporally different regions or even overlapping or in fact congruent regions. In the latter case the technical process is then described in duplicate by two different mathematical models.

If characteristics for the individual nodes and edges are used, then the colour red can be assigned, in FIG. 1, for example to the nodes 2a and the edges 3a, the colour blue to the nodes 2b and the edges 3b, whilst the edges 3c are red-blue or blue-red. Instead of colours also any other type of characterisations are however possible. Colours are suitable however particularly well for intuitive representation of the different regions of an entire graph 1.

Figure 2A:
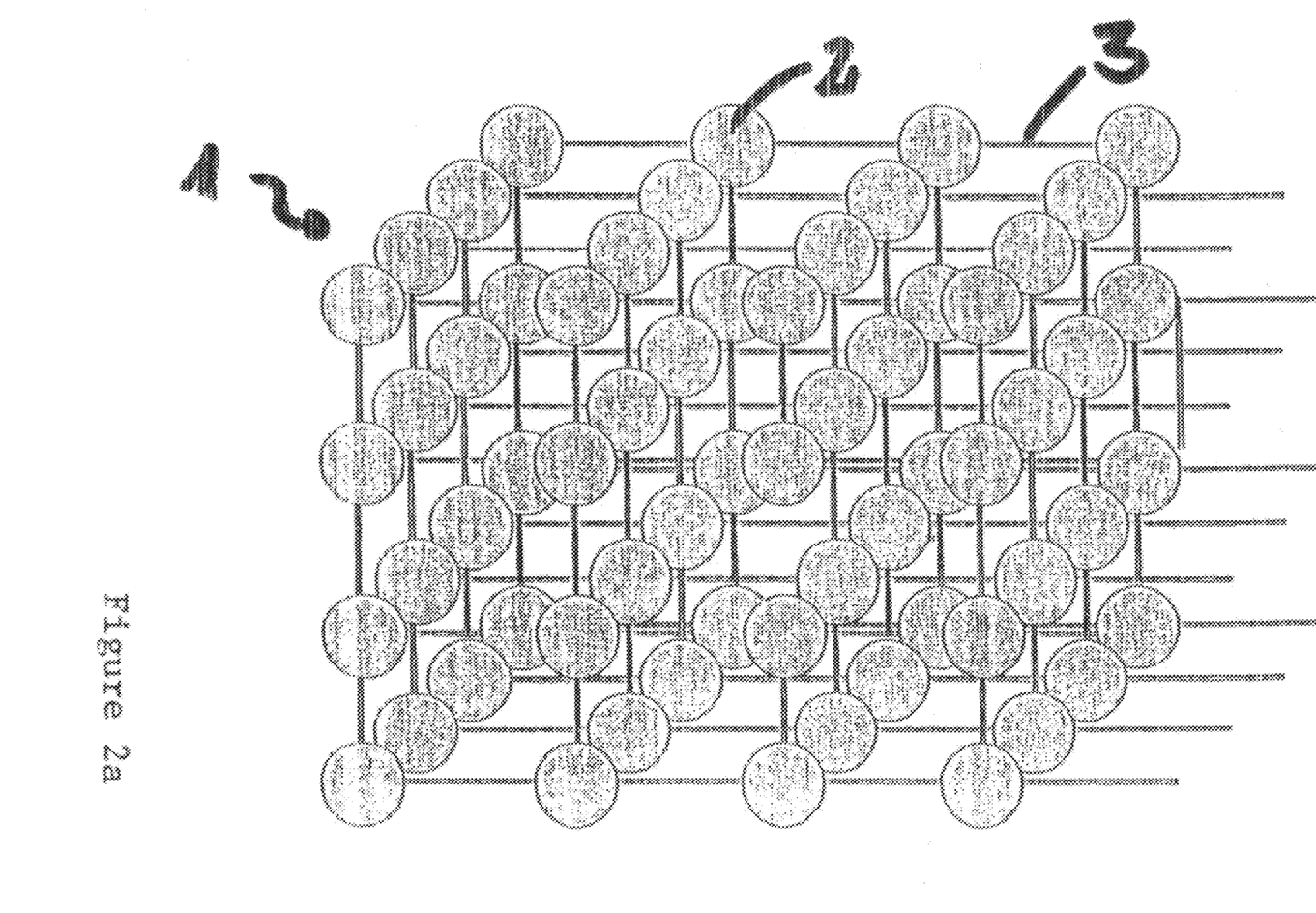
FIGS. 2a to 2c the parallelisation of a graph.
Figure 2B:
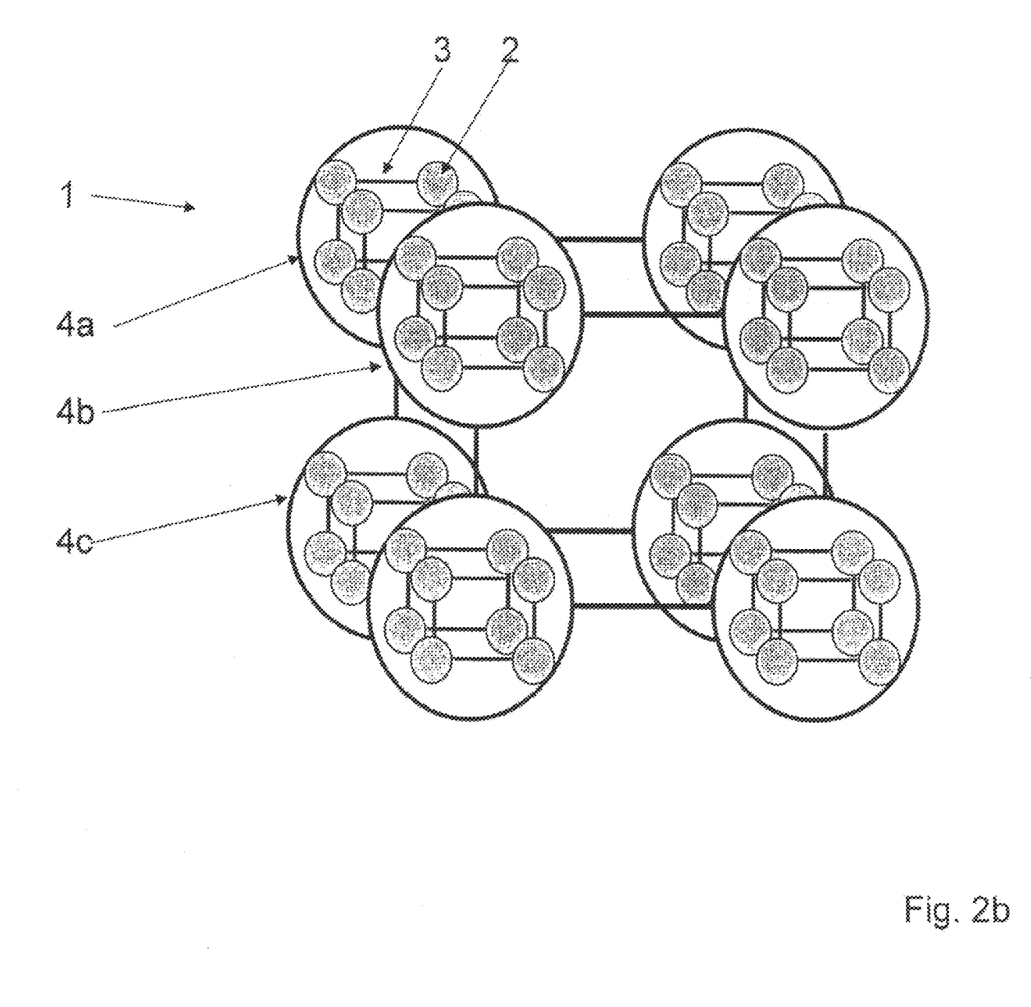
Figure 2C:
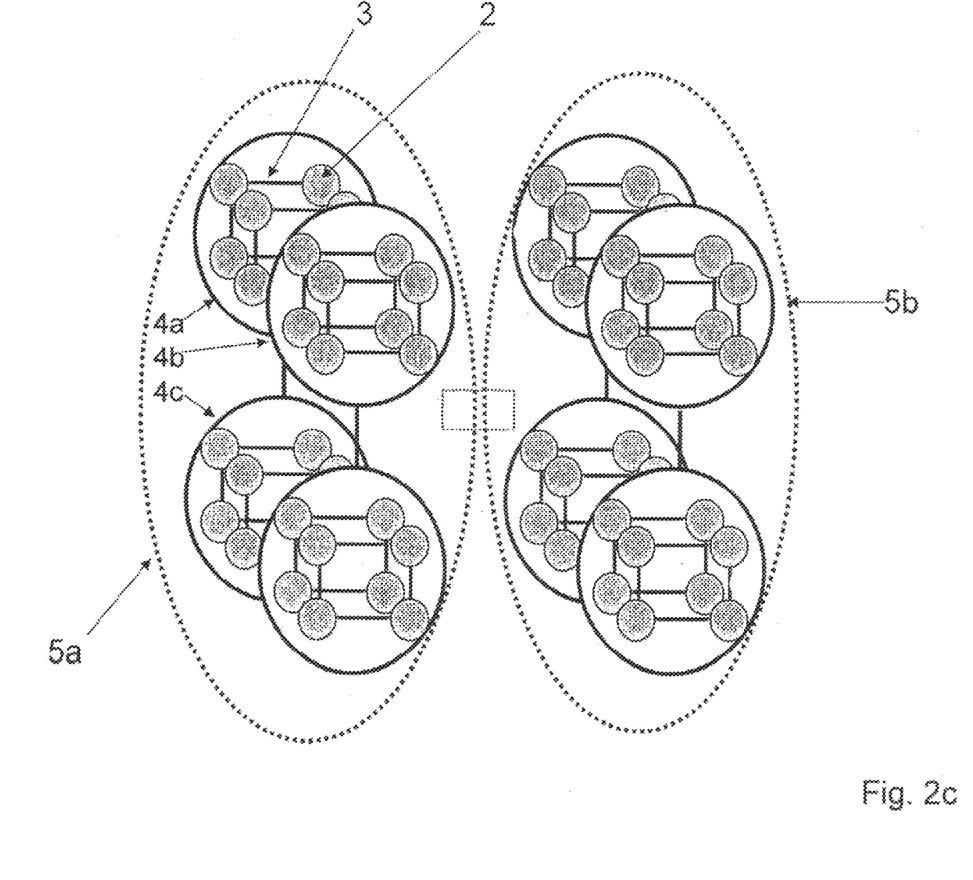

FIGS. 2A to 2C show the steps which are implemented during parallelisation of the graph 1 after the geometry and the algorithms of the mathematical models, as shown in FIG. 1, were reproduced on the graphs 1.

Firstly, partitioning of the graph 1 into individual regions 4a, 4b and 4c (see FIG. 2b) is effected and subsequently sub-division of the individual graph regions 4a, 4b and 4c onto individual calculation units (processors). The graph regions which are assigned respectively to one processor are connected in FIG. 2c by dotted lines and have the reference numbers 5a or 5b.

For these regions 5a or 5b, the calculation for propagation of the graph regions 4 is implemented subsequently then in a parallel manner. This is effected via generic loops, i.e. which are independent of the concrete technological process to be simulated, via the nodes and edges of the graph 1.

Figure 3:
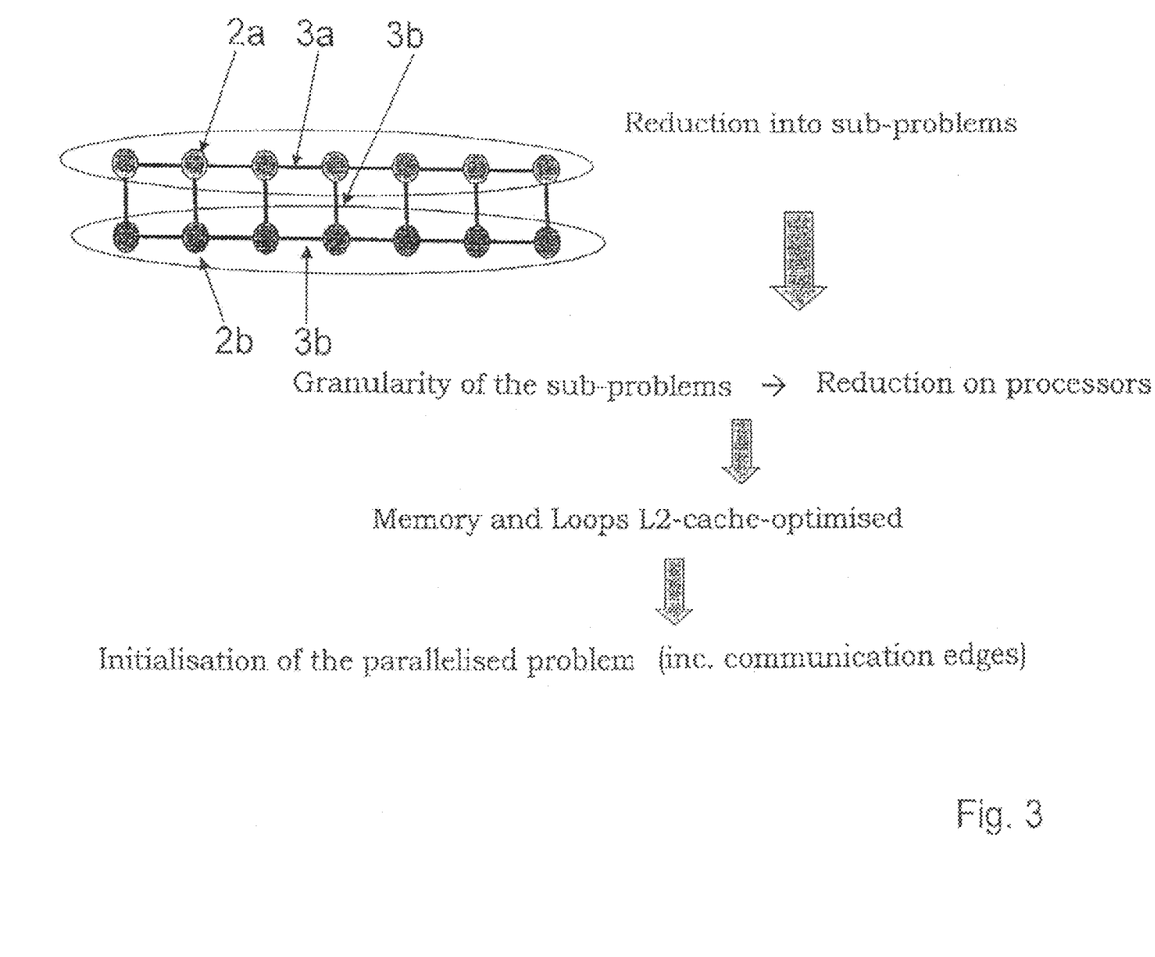
FIG. 3 the reduction of a graph.

FIG. 3 shows the reduction into sub-problems, a graph being represented here which represents the nodes 2a and 2b of different discretisation entities. In this example, the reduction of the entire graph into sub-problems and subsequently a further reduction onto the processors is effected. During the reduction onto the processors and the reduction into the sub-problems, the hardware can be taken into account and thus for example the memory use and the loops can be adapted to an L2-cache memory which is present. Finally, the parallelised problem is then initiated and calculated and thus the technical process is simulated.

Figure 4:
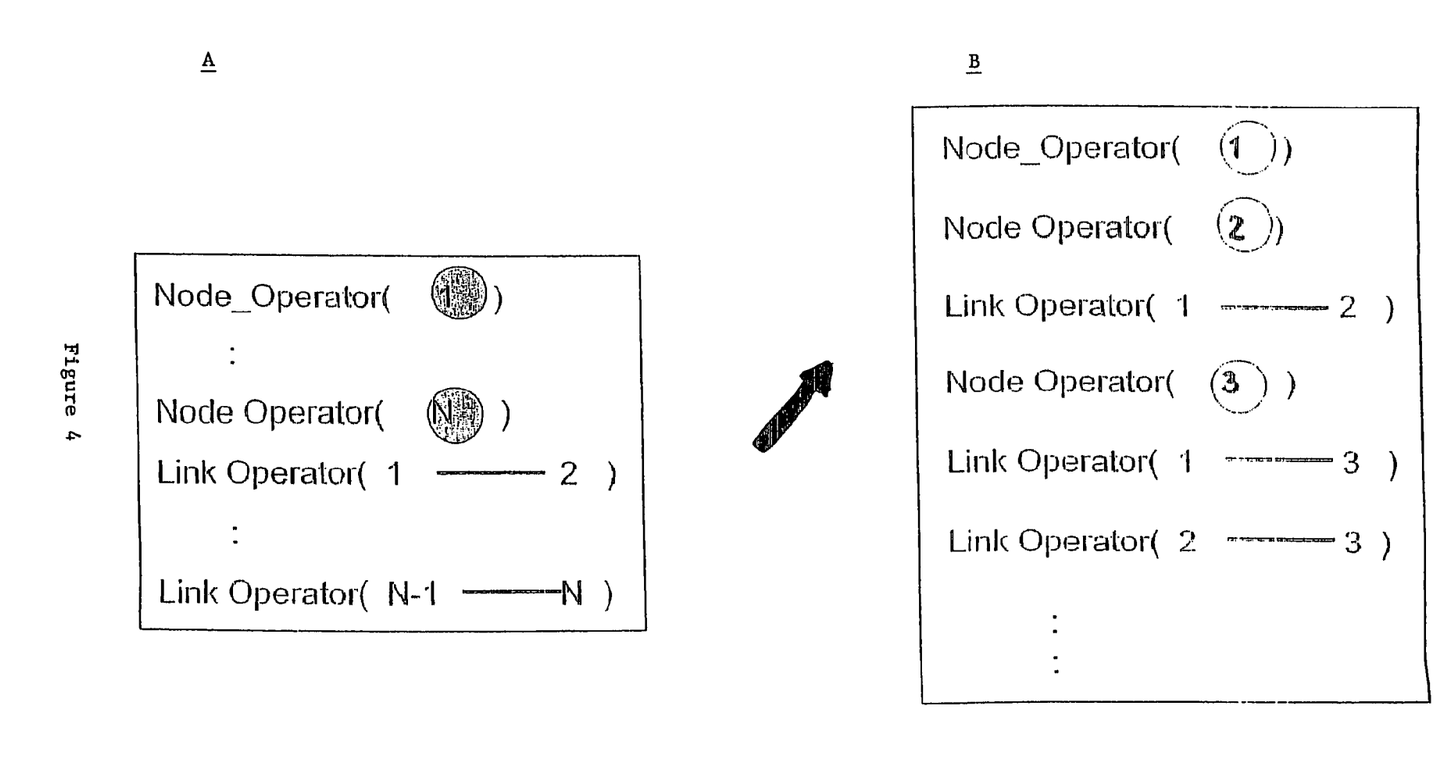
FIG. 4 the optimisation of the cache use by the method according to the invention.

FIG. 4 shows the logic pipeline which was optimised for an n-fold associated L2-cache memory. Instead, as in FIG. 4A and normal in the state of the art, of propagating firstly all the nodes during each evolution step (node_operator (.)) and only then propagating all the edges (link operator (.)), now a different mode of operation is chosen, as represented in FIG. 4. For this purpose, the information for one graph section is stored in respectively one memory region, for example 4a in FIG. 2C, and subsequently all the nodes and edges of this graph region are propagated. The result hereby is therefore primarily access to the information in one memory region of the cache memory. Only subsequently are the nodes and edges propagated, access to the second region of the cache memory being required for propagation thereof. Use of the cache memory is optimised as a result.

Figure 5:
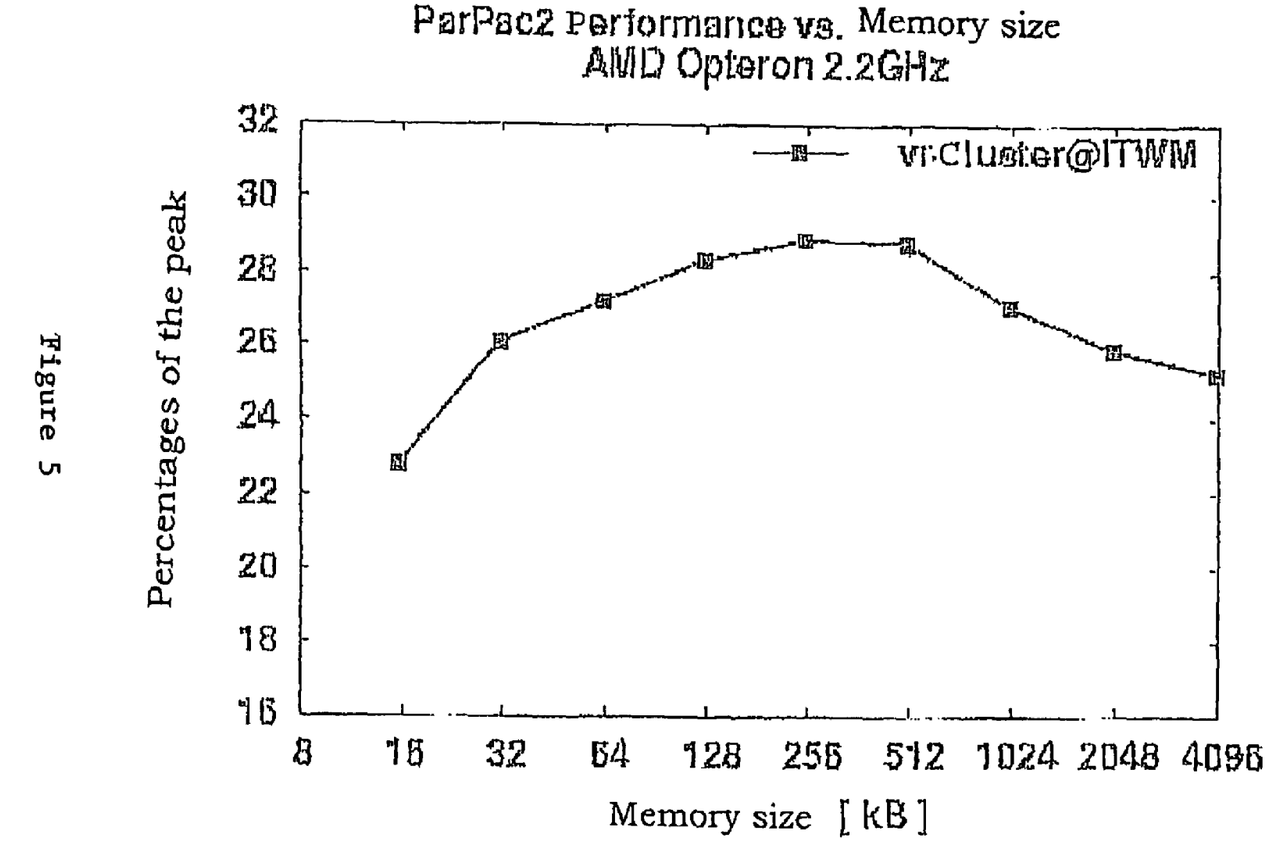
FIG. 5 the results of the method according to the invention using a four-fold associative L2-cache memory.

FIG. 5 shows the results which are achieved by this mode of operation. In a four-fold associative L2-cache memory (with a memory block size of 256 kB), a memory size (container size) of 256 kB was assigned to each sub-graph in the main memory, then, as described for FIG. 4, there being calculated by the respective processor firstly all the nodes and edges, the propagation of which was allocated to it and for which the required information was stored in the assigned container (memory block). Only finally was then the propagation of the entire graph determined. As can be detected in FIG. 5, there is produced with a container size of 256 kB, which corresponds precisely to a memory region of the four-fold associative L2-cache memory of 1024 kB, an optimum performance compared with container sizes which are smaller or larger. The method according to the invention therefore effects a very efficient resource use when using an L2-cache-based computer system.

Figure 6:
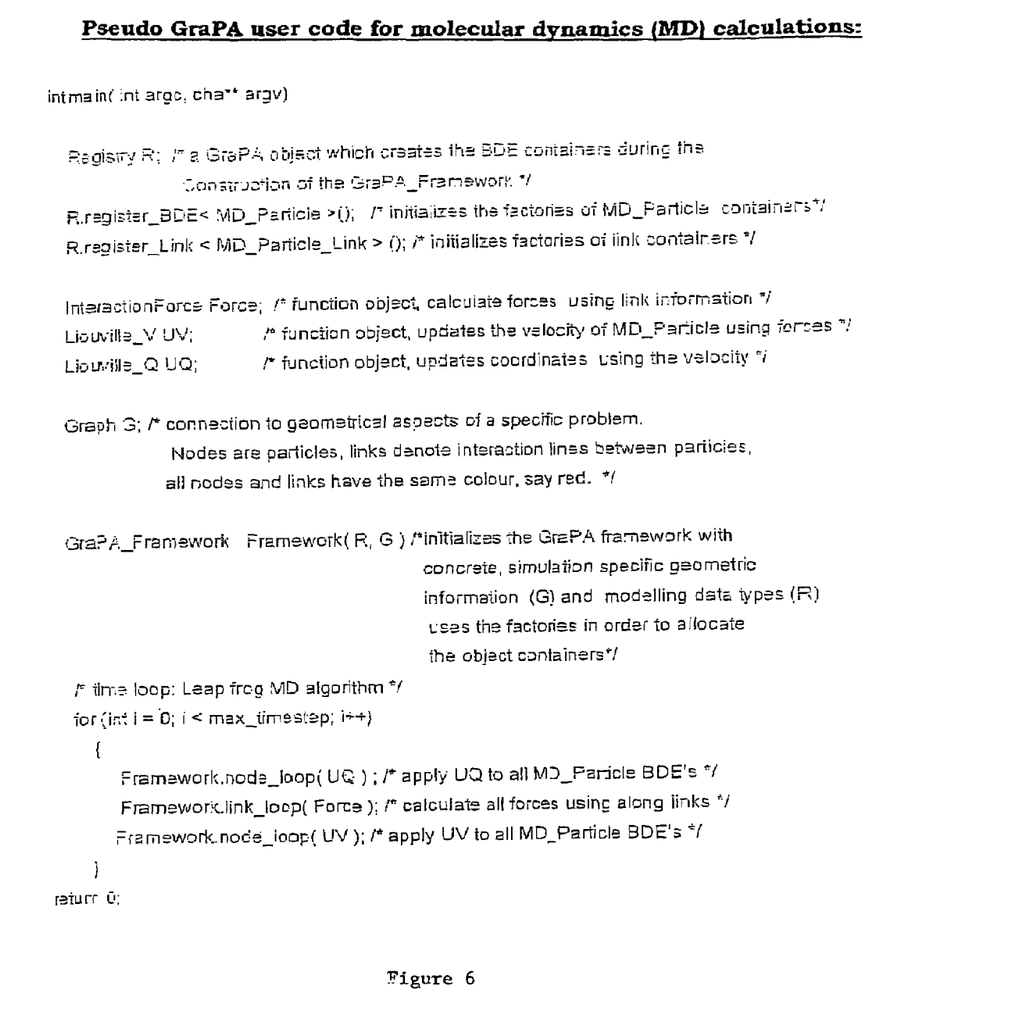
FIGS. 6 to 8 the pseudocode for the method according to the invention for implementation on a computer.
Figure 7:
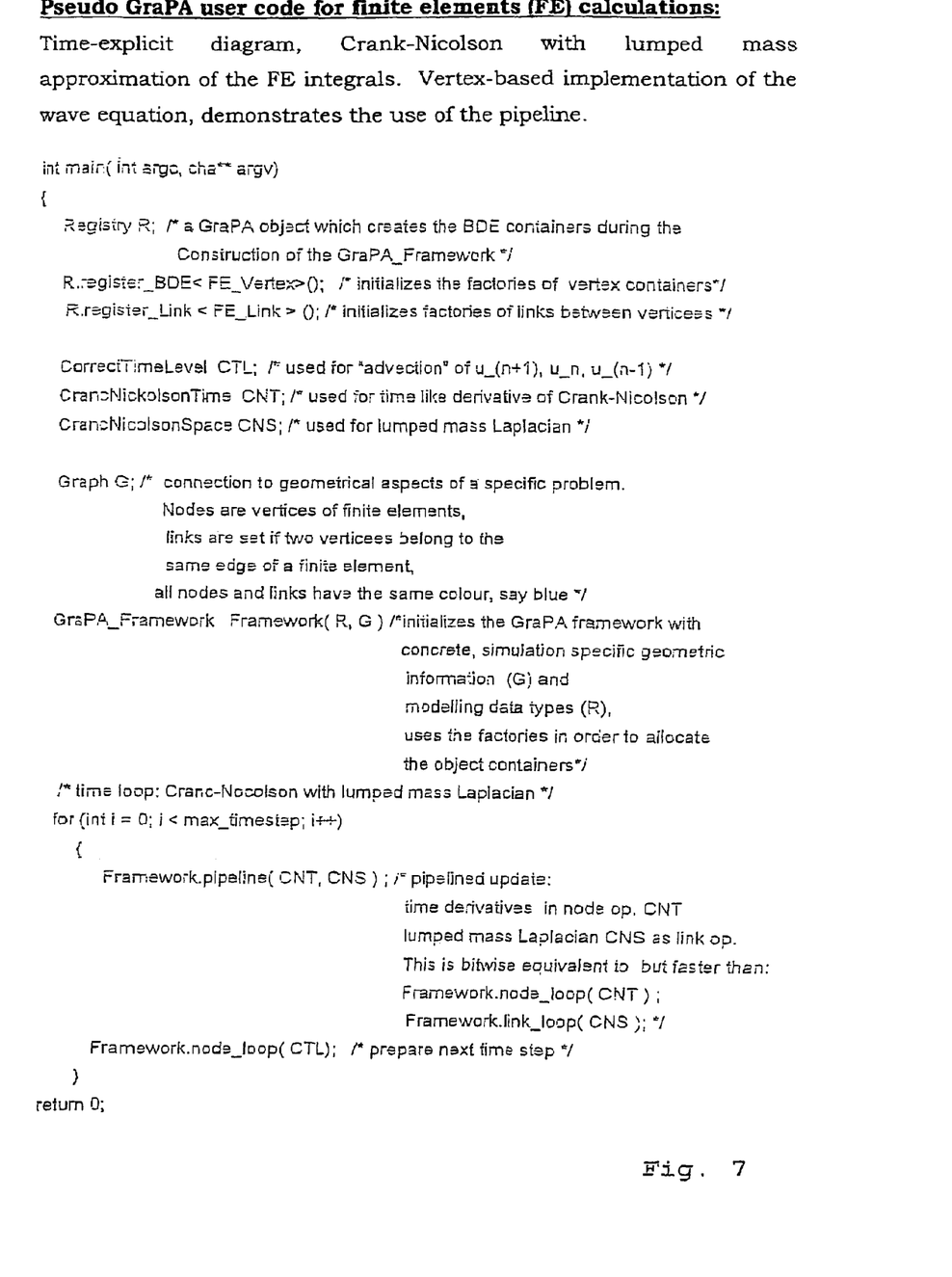

FIGS. 6 to 8 now show the pseudocode for initialisation and use of the method according to the invention.

In FIG. 6, the use of the method is shown merely with a mathematical model, here molecular dynamics. In FIG. 7, the use of merely one mathematical model is likewise effected using finite elements as discretisation entity.

Figure 8A:
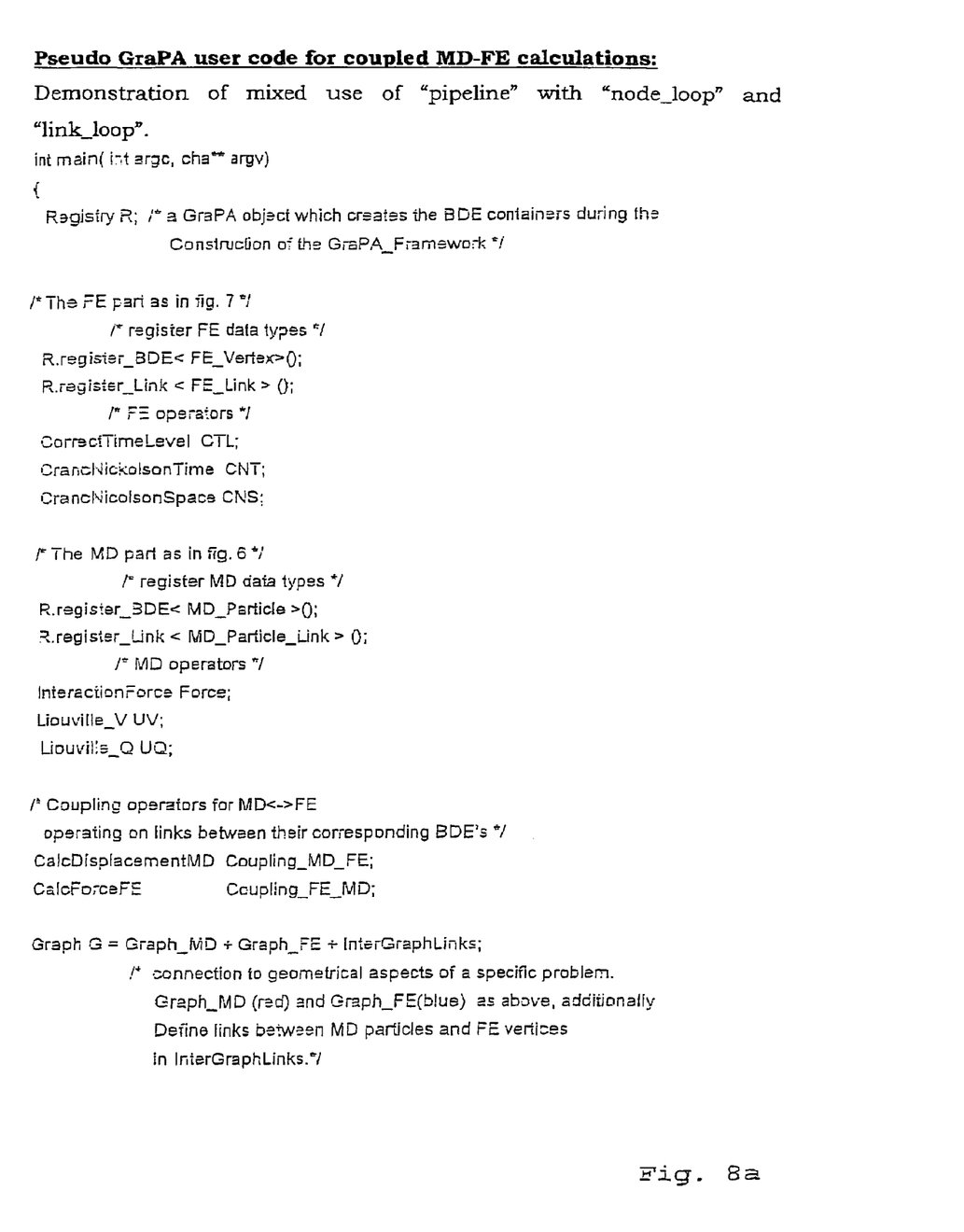
Figure 8B:
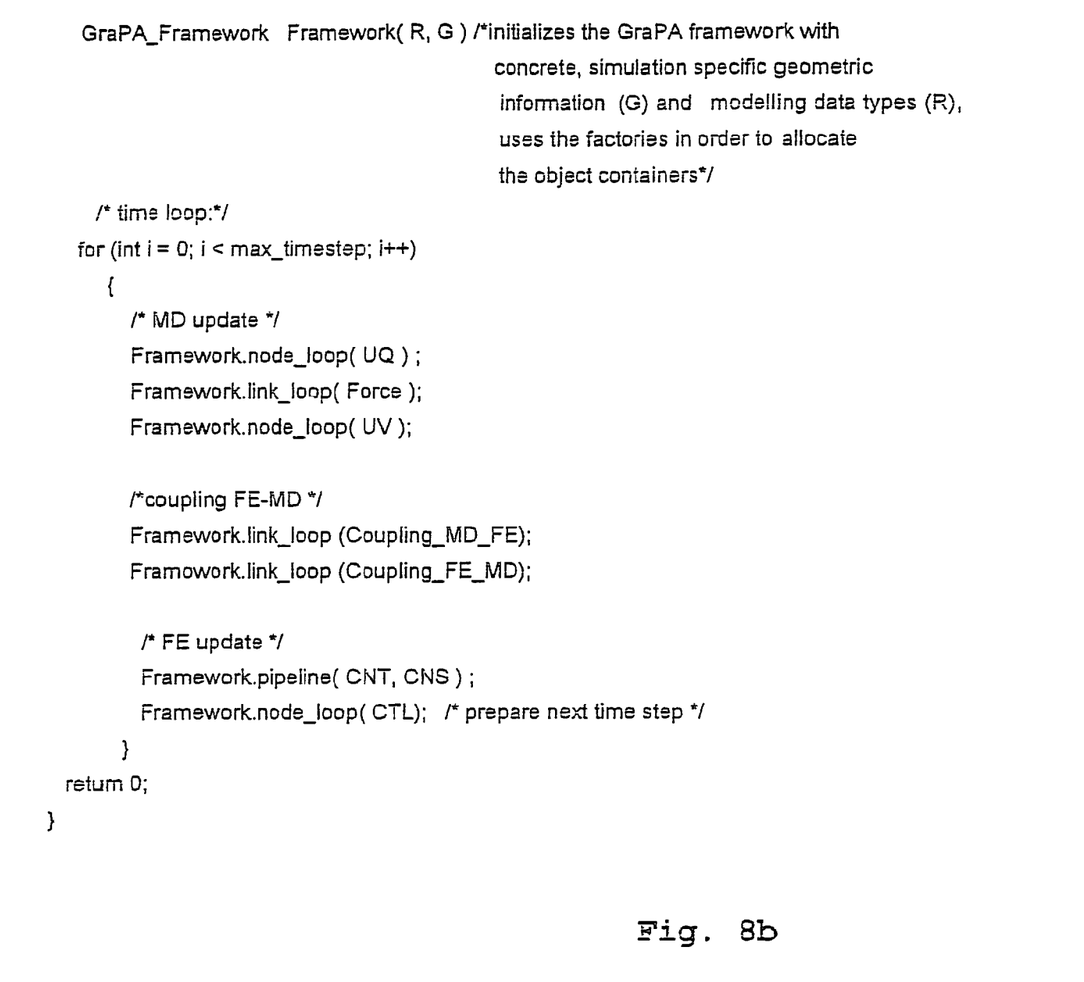

FIGS. 8A and 8B, which must be read serially, now combines these two elements from FIGS. 6 and 7 to form a method according to the invention.

In FIG. 6, firstly the nodes are set up with R.register_BDE and the edges of the graph with R.register_Link which are intended to reproduce a molecular dynamic model. Furthermore, with InteractionForce Force Liouville_V UV and Liouville_Q UQ, the propagation routines for calculation of the forces between the individual nodes, for the propagation of the speed V and also the propagation of the coordinates Q of the nodes are established. These general routines (propagation operators) apply for all the nodes and edges of the MD type (belonging to the molecular dynamic model).

With the Time Loop indicated in the pseudocode, the propagation is then implemented in that the above-mentioned propagation operators for respectively one time portion are applied to all the nodes and edges.

FIG. 7 shows the same system for finite elements as discretisation entity. Again, the nodes and edges of the graph are established here also via R.register_BDE and R.register_ Link, which reproduce the finite element model.

For propagation of the finite element model, now the propagation operators CorrectTimeLevel CTL, CrancNicolsonTime CNT and also CrancNicolsonSpace CNS are defined.

The propagation in the "Time Loop" situated in FIG. 7 is also effected here in that the mentioned three propagation operators are applied to all the nodes and edges.

The method according to the invention, as shown in FIGS. 8a and 8b, now combines both models and firstly makes a graph available in which the edges and nodes of the finite element model and the edges and nodes corresponding to the molecular dynamic model are defined. For each of the models, again the corresponding propagation operators (propagation functions) are defined as in FIGS. 6 and 7.

In addition, also link operators are now defined which couple to each other nodes of the molecular dynamic partial graph and the finite element partial graph which are connected to each other via edges. This is effected firstly as operator which calculates the displacement of the neighbouring finite element from the molecular dynamic model (CalcDisplacementMD) and, on the other hand, an operator which calculates the force acting on a particle in the molecular particle model from the finite element model (CalcForceFE).

Hence, the user has then completely defined the graph and the graph is then subsequently propagated in time (see portion "Time Loop") in which the mentioned propagation operators and coupling operators are applied to the nodes and edges corresponding to their respective property.

The invention claimed is:

1. A computer-aided method for simulation of temporal propagation of a technical process as an evolution problem, wherein the evolution problem is described by at least two different mathematical models as sub-evolution problems which use discretisation entities which are different from each other and are propagated in time using algorithms specific to the mathematical models, the simulation being implemented using a plurality of computer calculation units, the method comprising the steps of:

mapping the mathematical models on a single connected graph structure (1) with the discretisation entities as nodes (2) and producing neighbourhood relations thereof as edges (3), edges (3a, 3b) between discretisation entities belonging to the same model and also as edges (3c) between discretisation entities belonging to different models, using at least one of the computer calculation units, for the nodes assigned to a mathematical model, for the edges (3a, 3b) between nodes belonging to the same model and also for nodes belonging to different models, indicating specific evolution operators, using at least one of the computer calculation units, propagating the graph in time using the evolution operators, using at least one of the computer calculation units, and simulating the technical process by using the propagated graph.

2. Method according to claim 1, wherein the plurality of computer calculation units implement the simulation in an optimised and/or parallelised manner.

3. Method according to claim 1, wherein in the mapping step, a characteristic is assigned to each node (2a, 2b) which indicates the type of discretisation entity mapped by it.

4. Method according to claim 1, wherein in the mapping step, a characteristic is assigned to each edge (3a, 3b, 3c) which describes the type of both discretisation entities which were mapped on the nodes connected by the edge.

5. Method according to claim 1, wherein in the propagating step, the propagation of the graph is parallelised as an evolution problem independently of the evolution problem mapped on the graph.

6. Method according to claim 5, wherein the parallelisation includes the steps of:

partitioning of the graph (1) into partial graphs (4a, 4b, 4c), assigning one or more partial graphs (4a, 4b, 4c) to individual computer calculation units (5a, 5b), and calculating the propagation of the partial graphs (4a, 4b 4c) by the computer calculation units using the evolution operators, and combining the calculation results for calculation of the propagation of the graph (1).

7. Method according to claim 6, wherein the method is implemented on a computer with k cache memory levels with an at least n-fold associative cache memory with n memory regions, k and n being natural numbers.

8. Method according to claim 7, wherein in the propagating step, the graph (1) is partitioned into partial graphs (4a, 4b, 4c) in such a manner that each partial graph is stored in a memory region, the size of which corresponds to the size of one of the n memory regions of one of the cache memories.

9. Method according to claim 8, wherein in the propagating step, the propagation of all the nodes (2a, 2b) and edges (3a, 3b, 3c), for propagation of which data from the same memory region in the main memory are used, is calculated in a temporally coupled manner.

10. Method according to claim 7, wherein in the propagating step, the propagation of the nodes (2a, 2b) and edges (3a, 3b, 3c), for propagation of which data from a first memory region of the main memory are used, is calculated in a temporally coupled manner and subsequently the propagation of all the nodes (2a, 2b) and edges (3a, 3b, 3c), for propagation of which data from a second memory region are used, is calculated in a temporally coupled manner.

11. Method according to claim 7, wherein the method is implemented on a computer with n-fold associative level-2 cache memories (k=2) and the graph (1) is partitioned into partial graphs (4a, 4b, 4c) in such a manner that each partial graph occupies a memory region in the main memory, the size of which corresponds to the size of one memory block of the level-2 cache memory.

12. Method according to claim 1, wherein one of the mathematical models is molecular dynamics.

13. Method according to claim 1, wherein one of the mathematical models is a finite-element model.

14. Method according to claim 1, wherein one of the mathematical models is molecular dynamics and another of the mathematical models is a finite-element model.

* * * * *